United States Patent
Ji et al.

(10) Patent No.: US 9,214,357 B1
(45) Date of Patent: Dec. 15, 2015

(54) SUBSTRATE TREATING APPARATUS AND METHOD

(71) Applicant: PSK INC., Gyeonggi-do (KR)

(72) Inventors: Young Yeon Ji, Hwaseong-si (KR); Won Bum Seo, Hwaseong-si (KR); Byoung Hoon Kim, Hwaseong-si (KR)

(73) Assignee: PSK INC., Gyeonggi-do (KR)

( * ) Notice: Subject to any disclaimer, the term of this patent is extended or adjusted under 35 U.S.C. 154(b) by 0 days.

(21) Appl. No.: 14/465,131

(22) Filed: Aug. 21, 2014

(30) Foreign Application Priority Data

Aug. 6, 2014 (KR) .................. 10-2014-0101168

(51) Int. Cl.
*H01L 21/311* (2006.01)
*H01L 21/02* (2006.01)
*H01L 21/324* (2006.01)

(52) U.S. Cl.
CPC ...... *H01L 21/31122* (2013.01); *H01L 21/0234* (2013.01); *H01L 21/02274* (2013.01); *H01L 21/02334* (2013.01); *H01L 21/324* (2013.01)

(58) Field of Classification Search
CPC ................................. H01L 21/31122
USPC .......................................... 438/675
See application file for complete search history.

(56) References Cited

FOREIGN PATENT DOCUMENTS

| KR | 2001-0076979 A | 8/2001 |
|---|---|---|
| KR | 10-0784661 B1 | 12/2007 |
| KR | 2010-0007160 A | 1/2010 |
| KR | 10-2011-0061334 A | 6/2011 |

*Primary Examiner* — Anthony Ho
(74) *Attorney, Agent, or Firm* — Harness, Dickey & Pierce, P.L.C.

(57) ABSTRACT

The present invention disclosed herein relates to a substrate treating apparatus and method. The substrate treating method includes: providing a substrate on which an oxide layer is formed; treating the oxide layer with a first process gas in a plasma state to substitute the treated oxide layer with a by-product layer; and heating the substrate to remove the by-product layer at a temperature which is above a first heating temperature at which the by-product layer is decomposed and is above a second heating temperature that is a boiling point of an additive by-product generated while the by-product layer is decomposed.

8 Claims, 5 Drawing Sheets

SUBSTRATE TREATING APPARATUS AND METHOD

CROSS-REFERENCE TO RELATED APPLICATIONS

This U.S. non-provisional patent application claims priority under 35 U.S.C. §119 of Korean Patent Application No. 10-2014-0101168, filed on Aug. 6, 2014, the entire contents of which are hereby incorporated by reference.

BACKGROUND OF THE INVENTION

The present invention disclosed herein relates to a substrate treating apparatus and method.

To fabricate a semiconductor device, various processes, such as photolithography, etching, ion implantation, deposition, and cleaning are performed. Among these processes, etching includes an oxide etching. An oxide layer may be formed in a device isolation region for isolating an active region of a semiconductor device. Also, the oxide layer may be formed as an insulating layer. The oxide layer may be a native oxide layer unnecessarily formed during performing a process.

Such an oxide layer is etched so as to form a pattern or improve operation characteristics of a semiconductor device.

SUMMARY OF THE INVENTION

The present invention provides a substrate treating apparatus and method for efficiently treating a substrate.

The present invention also provides a substrate treating apparatus and method capable of etching an oxide layer.

The present invention also provides a substrate treating apparatus and method allowing a protective layer to be formed on a substrate from which an oxide layer is removed.

Embodiments of the present invention provide substrate treating methods including: providing a substrate on which an oxide layer is formed; treating the oxide layer with a first process gas in a plasma state to substitute the treated oxide layer with a by-product layer; and heating the substrate to remove the by-product layer at a temperature which is above a first heating temperature at which the by-product layer is decomposed and is above a second heating temperature that is a boiling point of an additive by-product generated while the by-product layer is decomposed.

In some embodiments, the first process gas may include a hydrogen gas, an oxygen gas, and a radical supply gas.

In other embodiments, the radical supply gas may be a compound containing a fluorine atom.

In still other embodiments, the by-product layer may be ammonium hexafluoro silicate decomposed at about 100° C.

In yet other embodiments, the second heating temperature may be not lower than about 240° C.

In even other embodiments, the second heating temperature may be not higher than about 500° C.

In further embodiments, the above substrate treating method may further include supplying a hydrogen supply gas excited to a plasma state to the substrate to form a protective layer on the substrate from which the oxide layer is removed.

In still further embodiments, the hydrogen supply gas may be one selected from an ammonia gas, a hydrogen gas, and a methane gas.

In other embodiments of the present invention, substrate treating apparatuses include: a first process module treating an oxide layer on a substrate with a first process gas in a plasma state to substitute the oxide layer with a by-product layer; and a second process module heating the substrate to remove the by-product layer at a temperature which is above a first heating temperature at which the by-product layer is decomposed and is above a second heating temperature that is a boiling point of an additive by-product generated while the by-product layer is decomposed.

In some embodiments, the first process module may include: a chamber; a susceptor disposed inside the chamber; a process gas supply unit supplying the first process gas onto the chamber; and a plasma excitation unit exciting the first process gas to a plasma state.

In other embodiments, the second process module may include: a process chamber; a substrate support member disposed inside the process chamber and having a lower electrode and a heater; and a gas supply member supplying a gas onto the process chamber.

In still other embodiments, the first heating temperature may be about 100° C.

In yet other embodiments, the second heating temperature may be about 240° C.

BRIEF DESCRIPTION OF THE DRAWINGS

The accompanying drawings are included to provide a further understanding of the present invention, and are incorporated in and constitute a part of this specification. The drawings illustrate exemplary embodiments of the present invention and, together with the description, serve to explain principles of the present invention. In the drawings.

DETAILED DESCRIPTION OF PREFERRED EMBODIMENTS

Hereinafter, exemplary embodiments will be described in detail with reference to the accompanying drawings. The embodiments of the present invention may be modified in various forms, and the scope of the present invention should not be construed as limited to the following embodiments. These embodiments are provided so that this disclosure will more fully convey the concept of the invention to those skilled in the art. Therefore, the shapes of elements are exaggerated for more clear description.

Figure 1:
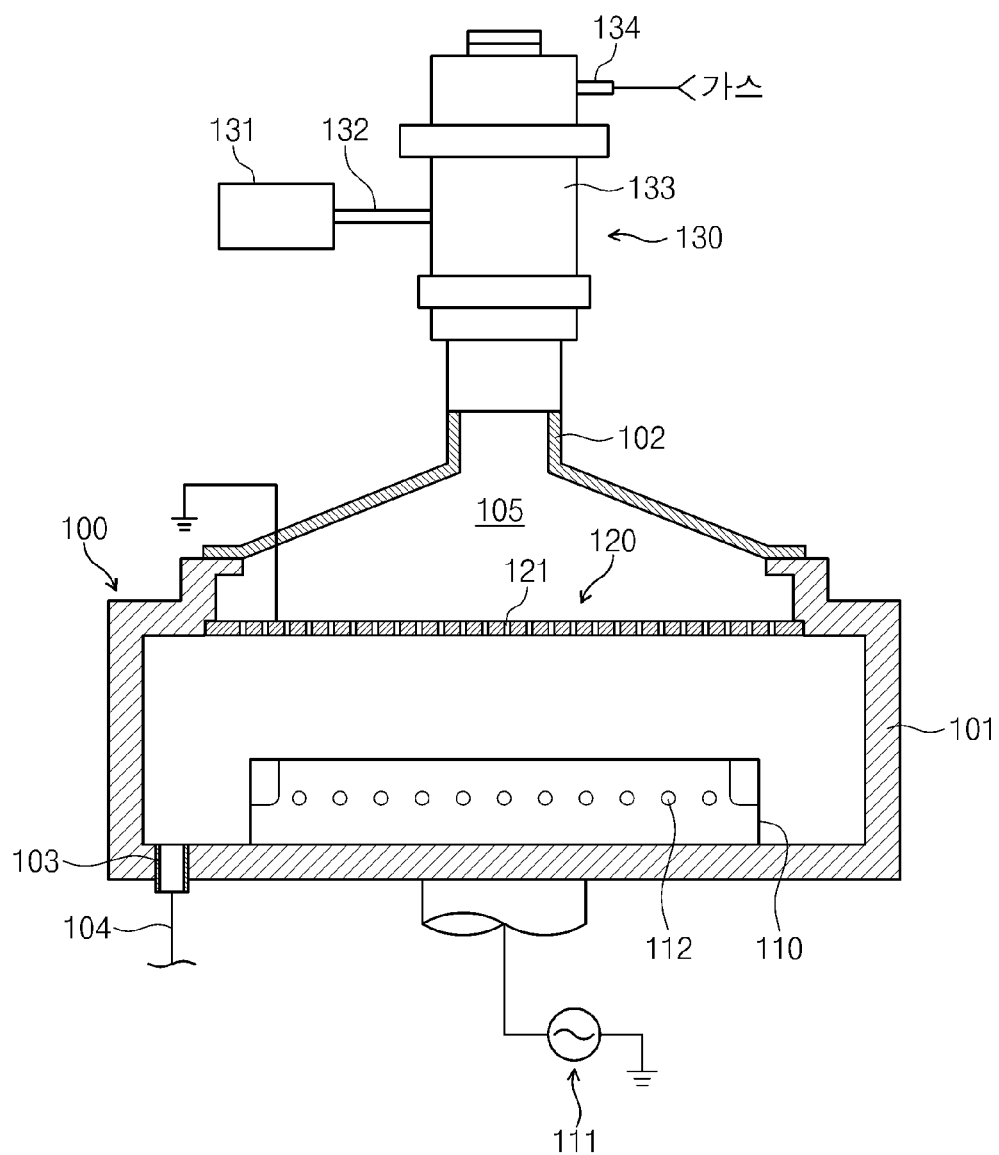
FIG. 1 is a schematic view illustrating a first process module.
Figure 2:
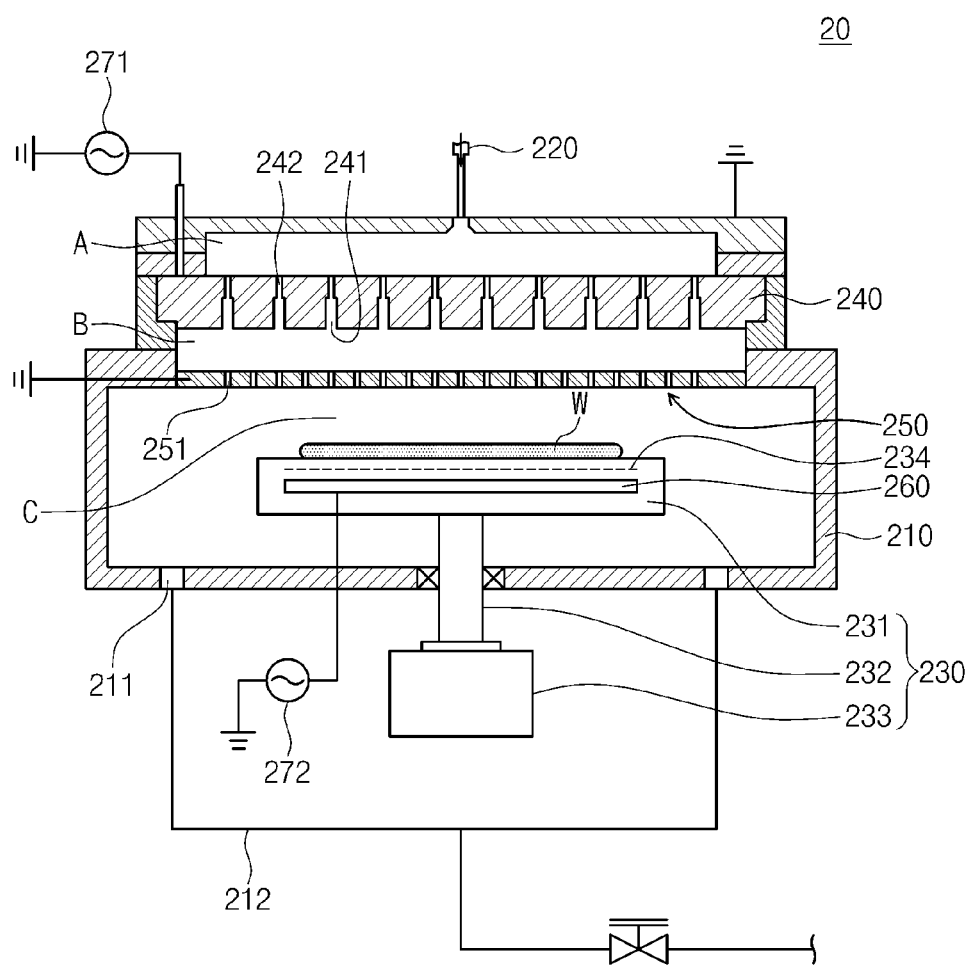
FIG. 2 is a schematic view illustrating a second process module.

FIG. 1 is a schematic view illustrating a first process module and FIG. 2 is a schematic view illustrating a second process module.

Referring to FIGS. 1 and 2, a substrate treating apparatus according to an embodiment of the present invention includes a first process module 10 and a second process module 20.

The first process module 10 includes a susceptor 110, a shower head 120, and a plasma excitation unit 130.

The chamber 100 provides a space where a substrate treating process is performed. The chamber 100 has a body 101 and a seal cover 102. The body 101 has an opened upper surface, and a space formed therein. An opening (not illustrated) through which a substrate (W) is loaded or unloaded is formed at a sidewall of the body 101, and is opened or closed by an opening/closing member, such as a slit door (not illustrated). The opening/closing member closes the opening while a substrate (W) treatment is performed in the chamber 100, and opens the opening when the substrate (W) is loaded into the chamber 100 and is unloaded from the chamber 100 to the outside.

An exhaust hole 103 is formed at a lower sidewall of the body 101. The exhaust hole 103 is connected to an exhaust line 104. The inner pressure of the chamber 100 is adjusted through the exhaust line 104, and a reaction byproduct generated in a process is exhausted to the outside of the chamber 100.

The seal cover 102 is coupled to an upper wall of the body 101 and covers the opened upper surface of the body 101 to seal the inside of the body 101. An upper end of the seal cover 102 is connected to the plasma excitation unit 130. The seal cover 102 is formed with a diffusion space 105. As the diffusion space 105 is closer to the shower head 120, the width of the diffusion space 105 increases gradually. For example, the diffusion space 105 may have a reverse funnel shape.

The susceptor 110 is disposed inside the chamber 100. A substrate is placed on the susceptor 110. The susceptor 110 may be provided therein with a cooling passage (not illustrated) through which a cooling fluid is circulated. The cooling fluid cools the susceptor 110 while being circulated along the cooling passage. Power may be applied from a bias power source 111 to the susceptor so as to adjust a treatment degree of the substrate (W) to be treated by plasma. The power applied by the bias power source 111 may be a radio frequency (RF) power source. The susceptor 110 may form a sheath by the power supplied by the bias power source 111 and form high density plasma in that region, thus improving process ability.

A heating member 112 may be provided inside the susceptor 110. In an example, the heating member 112 may be provided in the form of a heat wire. The heating member 112 heats the substrate (W) to a preset temperature.

The shower head 120 is coupled to the upper wall of the body 101. The shower head 120 has a circular plate shape and is disposed in parallel to a top surface of the susceptor 110. The shower head 120 may be formed of an aluminum material a surface of which is oxidized. The shower head 120 is formed with distribution holes 121. The distribution holes 121 may be formed at a constant interval on a concentric circumference in order to uniformly supply radicals. Plasma diffused in the diffusion space 105 is introduced into the distribution holes 121. At this time, charged particles, such as electrons or ions are confined to the shower head 120, and neutral particles, such as oxygen radicals or the like pass through the distribution holes 121 and are then supplied to the substrate (W). Also, the shower head 120 may be grounded to form a passage for movement of electron or ions.

The plasma excitation unit 130 generates plasma and supplies the generated plasma to the chamber 100. The plasma excitation unit 130 may be provided on the chamber 100. The plasma excitation unit 130 includes an oscillator 131, a waveguide tube 132, a dielectric tube 133, and a process gas supply unit 134.

The oscillator 131 generates an electromagnetic wave. The waveguide tube 132 connects the oscillator 131 and the dielectric tube 133 to provide a passage allowing an electromagnetic wave generated from the oscillator 131 to be transferred to an inside of the dielectric tube 133. The process gas supply unit 134 supplies a process gas to an upper side of the chamber 100. The supplied process gas may be a first process gas according to a process flow. The process gas supplied to the inside of the dielectric tube 133 is excited to a plasma state by the electromagnetic wave. The plasma is introduced into the diffusion space 105 via the dielectric tube 133.

While the above embodiment exemplarily shows and describes that the plasma excitation unit 130 uses an electromagnetic wave, the plasma excitation unit 130 may be provided as an inductive coupling plasma excitation unit or a capacitive coupled plasma excitation unit in other embodiments.

The second process module 20 includes a process chamber 210, a gas supply member 220, a substrate support member 230, a hollow cathode 240, a baffle 250, a lower electrode 260, and power supply sources 271 and 272.

The chamber 210 provides a space where a substrate treating process is performed. An exhaust hole 211 for exhausting a gas is formed in a bottom of the process chamber 210. An exhaust line 212 on which a pump is installed is connected to the exhaust hole 211 to exhaust a by-product in the process chamber 210 and maintain the inside of the process chamber 210 at a process pressure. The gas supply member 220 supplies a gas necessary for a substrate treating process to the inside of the process chamber 210.

The substrate support member 230 is positioned at the inside of the process chamber 210. The substrate support member 230 supports the substrate (W). The substrate support member 230 is provided with a lower electrode 260. The substrate support member 230 may be also provided with a heater 234 for heating the substrate. The substrate support member 230 may be fixed, rotated or vertically moved up and down according to selection. The substrate support member 230 includes a support plate 231, a driving shaft 232, and a driver 233 in order to support the substrate (W). The substrate (W) is placed in parallel to the support plate 231 on the support plate 231. One end of the driving shaft 232 is connected to a lower side of the support plate 231 and the other end of the driving shaft 232 is connected to the driver 233. A rotational force generated by the driver 233 is transferred to the driving shaft 232 and thus the driving shaft 232 is rotated together with the support plate 231.

The hollow cathode 240 is positioned inside the process chamber 210. The hollow cathode 240 is formed with holes 242 for flow of a gas. The hollow cathode 240 is formed at a bottom thereof with a plurality of lower grooves 241 from which plasma is generated.

The baffle 250 is disposed spaced apart from the hollow cathode 240. The baffle 250 is formed with a plurality of injection holes 251. The upper power supply source 271 applies power to the hollow cathode 240 and the lower power supply source 272 applies power to the lower electrode 260. The baffle 250 is grounded.

The gas supply member 220 is positioned at an upper side inside the process chamber 210, the hollow cathode 240 is positioned under the gas supply member 220, the baffle 250 is positioned under the hollow cathode 240, and the substrate support member 230 is positioned under the baffle 250.

The gas supply member 220 supplies a gas to a gas introduction portion "A". The gas introduction portion "A" indicates a space between the top surface of the process chamber 210 and the hollow cathode 240 provided on the process chamber 210.

A space between the hollow cathode 240 and the baffle 250 is provided as a first plasma generation portion "B". The gas introduced from the gas introducing portion "A" is supplied to the first plasma generation portion "B" and is then excited to a plasma state by the hollow cathode 240 and the baffle 250.

A space between the baffle 250 and the substrate support member 230 is provided as a second plasma generation portion "C". A plasma gas generated in the first plasma generation portion "B" is once more excited by the baffle 250 and the lower electrode 260. Therefore, the density of plasma is much higher and more uniform in the second plasma generation portion "C" than that in other portions.

As described above, an RF power is applied to the hollow cathode 240 and the lower electrode 260, and the baffle 250 is grounded. Plasma generated in the hollow cathode 240 passes through the injection holes 251 formed in the baffle 250 and moves toward the substrate (W) placed on the substrate support member 230. At this time, due to subsidiary functions of the above-described baffle 250, charged particles, such as electrons or ions are prevented from being introduced into the second plasma generation portion "C" by the baffle 250 mainly made of aluminum or anodized aluminum, and only neutral particles, such as oxygen radicals may arrive at the substrate (W) on the substrate support member 230 to treat the substrate (W).

In another embodiment, the upper power supply source 271 may be omitted. Therefore, the gas may be excited to a plasma state by an electromagnetic field induced to the space between the baffle 250 and the substrate support member 230.

While the above embodiment exemplarily shows and describes that the second process module 20 excites a gas to a plasma state by an inductive coupling method, the second process module may excite the gas to a plasma state by using an electromagnetic wave or a capacitive-coupling method, similarly to the first process module 10.

Figure 3:
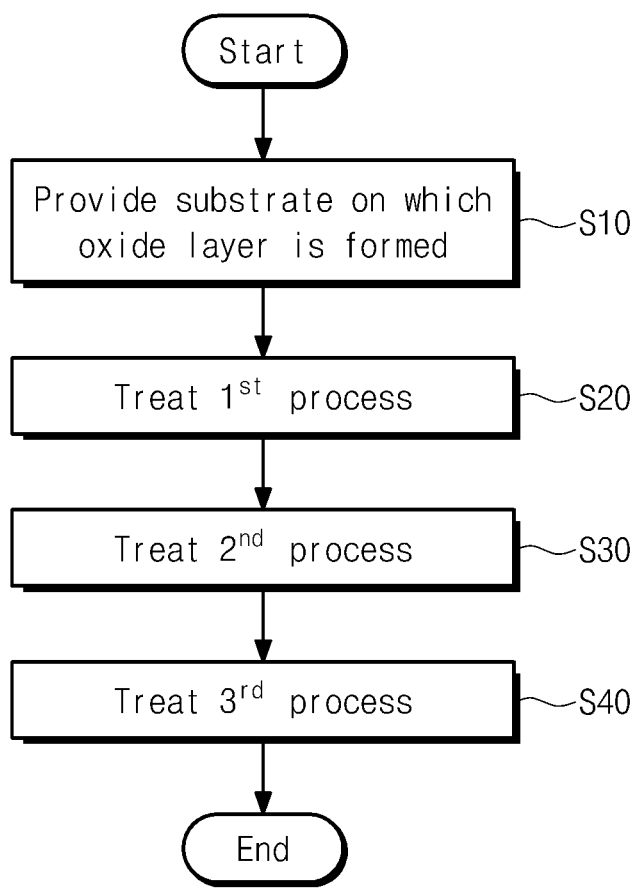
FIG. 3 is a flow chart showing a substrate treating process according to an embodiment of the present invention.
Figure 4:
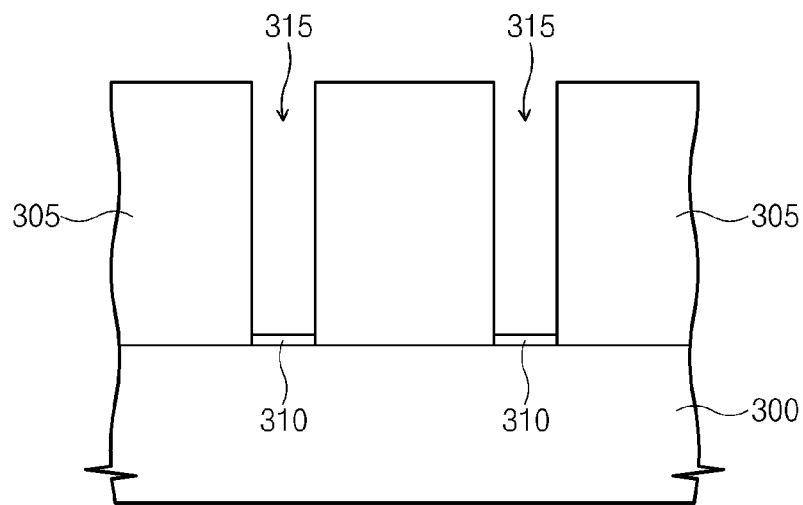
FIG. 4 is a cross-sectional view illustrating a substrate to be treated according to an embodiment of the present invention.

FIG. 3 is a flow chart showing a substrate treating process according to an embodiment of the present invention and FIG. 4 is a cross-sectional view illustrating a substrate to be treated according to an embodiment of the present invention.

Referring to FIGS. 3 and 4, a substrate (W) on which an oxide layer 310 is formed is provided. In an example, the substrate (W) may be in a state that an insulating layer 305 is formed on a wafer 300 that is a base substrate. The substrate (W) may be formed with a device isolation region and an active region defined by the device isolation region. The substrate (W) may be in a state that a process of forming an insulating layer, a process of forming a photoresist pattern on the insulating layer, a process of etching the insulating layer, an ashing process of removing the photoresist pattern, and a cleaning process have been sequentially performed. A portion of the wafer 300 is exposed through an opening 315 from which the insulating layer 305 is etched and reacts with the surrounding oxygen to form a native oxide layer 320. Also, the substrate (W) may be in a state that a deposition process, a developing process, an etching process, and a cleaning process have been performed in order to form a pattern. Furthermore, the substrate (W) may be in a state that the substrate (W) reacts with the surrounding oxygen to form a native oxide layer after the cleaning process is performed.

The first process module 10 performs a first process for the substrate (W). The process gas supply unit 134 first supplies a first process gas. The first process gas includes hydrogen, oxygen, and a radical supply gas. The radical supply gas may be provided in the form of a compound containing fluorine atoms. For example, the radical supply gas may be provided in the form of nitron fluorine three ($NF_3$), carbon tetrafluoride ($CF_4$), difluoro methane, trifluoro methane, or the like. Also, the radical supply gas may be provided in the form of a mixture gas of at least two selected from nitron fluorine three ($NF_3$), carbon tetrafluoride ($CF_4$), difluoro methane, and trifluoro methane. The first process gas is supplied to the substrate (W) after being excited to a plasma state by the plasma excitation unit 130.

Figure 5:
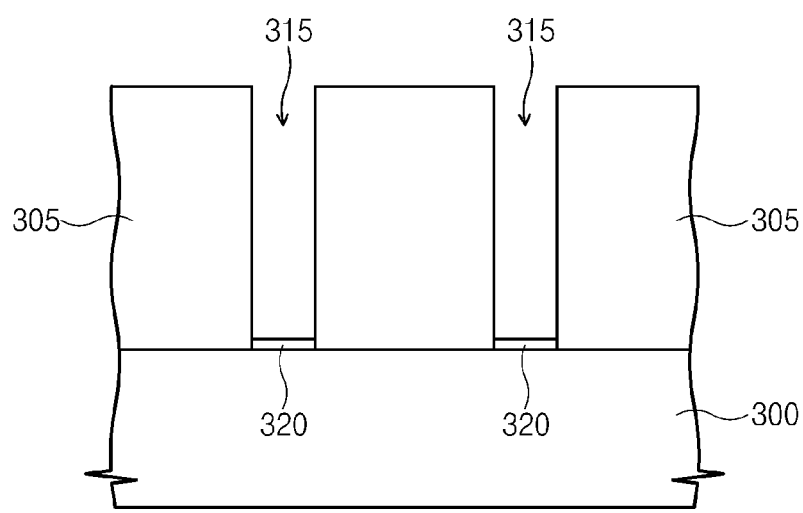
FIG. 5 is a cross-sectional view illustrating a substrate on which a by-product layer is formed.

FIG. 5 is a cross-sectional view illustrating a substrate on which a by-product layer is formed.

Referring to FIG. 5, the first process gas excited to the plasma state reacts with the oxide layer 310 to form a by-product layer 320. In detail, the first process gas reacts with the oxide layer 310 to form ammonium hexafluorosilicate and water. The water is exhausted in the form of vapor. The ammonium hexafluorosilicate remains on the substrate (W) as the by-product layer 320.

The by-product layer 320 is removed from the substrate (W) through a second process. The substrate (W) which is subject to the first process is drawn from the first process module 10 and then loaded into the second process module 20. The heater 234 provided to the substrate support member 230 heats the substrate (W) to a set temperature in the second process. As the substrate (W) is heated to a first heating temperature or higher, the by-product layer 320 is removed from the substrate (W). In detail, as the substrate (W) is heated above 1,000° C., the by-product layer 320 may be decomposed into ammonium bifluoride, ammonia, and silicon tetrafluoride ($SiF4$). Among these, ammonia and silicon tetrafluoride may be discharged from the chamber in the state of a gas.

While the substrate (W) is heated, an additive by-product may be generated. One of the additive by-products may be ammonium bifluoride generated in the course of decomposing the by-product layer 320. Also, an oxide remaining on the heated substrate may react with vapor to form a silicic acid layer. Since such additive byproducts exist in a solid state even at a temperature or higher at which the by-product layer 320 is decomposed, the additive byproducts may form particles. As the substrate (W) is heated to a second heating temperature or higher, the additive by-products are removed from the substrate (W). The second heating temperature may be provided as a boiling point of the additive by-products. The boiling point of the silicic acid layer is 150° C. Also, the boiling point of ammonium bifluoride is 240° C. Therefore, the second heating temperature may be 240° C. at which both of the silicic acid layer and ammonium bifluoride are in a gas state. Improvement in efficiency of removing the by-product layer according to a temperature rise is extremely low or is not shown at a temperature of 500° C. or higher. Therefore, the second heating temperature is adjusted to a temperature not higher than 500° C. to thus improve the energy efficiency according to the process treatment.

Figure 6:
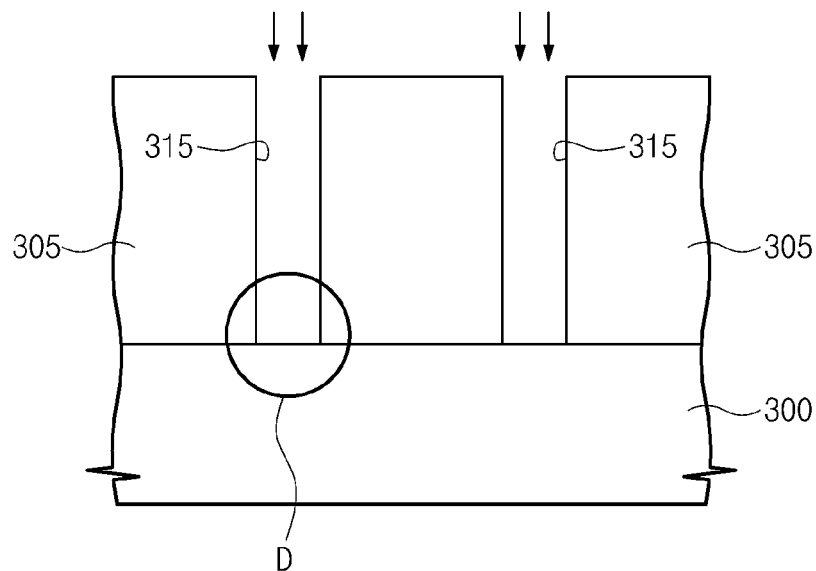
FIG. 6 is a cross-sectional view illustrating a substrate on which a protective layer is being formed.
Figure 7:
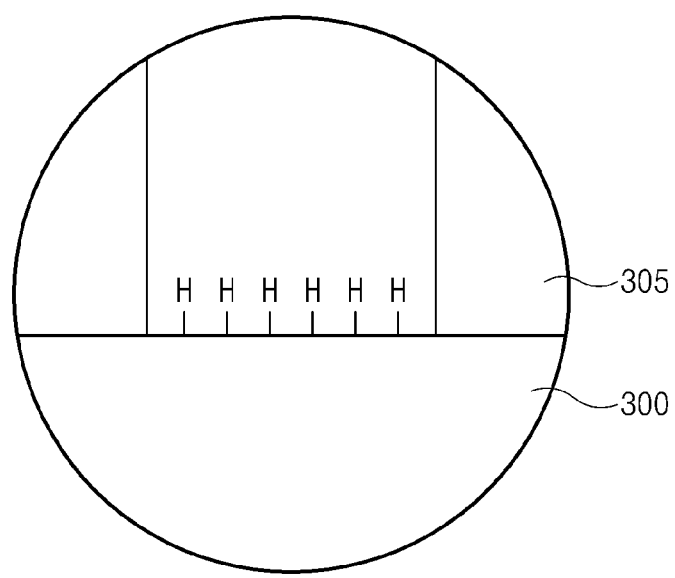
FIG. 7 is a detailed view of region "D" of FIG. 6.

FIG. 6 is a cross-sectional view illustrating a substrate on which a protective layer is being formed and FIG. 7 is a detailed view of region "D" of FIG. 6.

Referring to FIGS. 6 and 7, a protective layer is formed through a third process on the substrate (W) from which the by-product layer 320 is removed (S40). The gas supply member 220 supplies a hydrogen supply gas to the inside of the process chamber 210. The hydrogen supply gas may be a gas including a hydrogen atom, for example, an ammonia gas, a hydrogen gas, a methane gas, or the like. As the hydrogen supply gas is excited to a plasma state, hydrogen in the plasma state is supplied onto the substrate (W). The hydrogen in the plasma state reacts with the substrate (W) to form a protective layer on a surface of the substrate (W).

The surface of the substrate (W) from which the by-product layer is removed has an increased chemical reactivity. In detail, a dangling bond may be formed at a portion of the substrate from which the oxide layer 310 is removed. That is, a silicon atom having an outermost electron which is not chemically bonded exists on a surface of the substrate (W). Such silicon atoms form the native oxide layer 310 when contacting oxygen before a subsequent process after the oxide layer 310 is removed from the substrate (W).

On the other hand, the substrate treating apparatus according to an embodiment of the present invention allows a protective layer to be formed on a surface of the substrate (W), thereby capable of preventing the native oxide layer 310 from being formed on the substrate (W). In particular, the hydrogen in plasma state reacts with silicon atom having a high chemical reactivity.

The substrate treating apparatus according to another embodiment may be provided in a single process module to perform first to third processes sequentially.

According to embodiments of the present invention, substrate treating apparatus and method capable of efficiently treating a substrate may be provided.

According to embodiments of the present invention, substrate treating apparatus and method capable of efficiently an oxide layer may be provided.

According to embodiments of the present invention, substrate treating apparatus and method allowing a protective layer to be formed on a substrate from which an oxide layer is removed.

The above description is provided for exemplifying the present invention. Also, the above description has been made for illustrating and explaining preferred embodiments of the present invention, and the present invention may be used in other combinations, alternatives and environments. That is, the present invention may be changed or modified within the scope of the inventive concept disclosed in the specification, the scope equivalent to the described disclosure, and/or the scope of the art or knowledge known in the art. The above-described embodiments are provided for explaining the best mode to realize the technical spirit of the present invention, and various changes required in concrete application field and use of the present invention will be possible. Therefore, the above detailed description is not intended to limit the present invention to disclosed modes of practice. Also, the accompanying claims should be construed as including other modes of practice.

What is claimed is:

1. A substrate treating method comprising:
   providing a substrate on which an oxide layer is formed;
   treating the oxide layer with a first process gas in a plasma state to substitute the treated oxide layer with a by-product layer, and
   heating the substrate to remove the by-product layer at a temperature which is above a first heating temperature at which the by-product layer is decomposed and is above a second heating temperature that is a boiling point of an additive by-product generated while the by-product layer is decomposed.

2. The substrate treating method of claim 1, wherein the first process gas comprises a hydrogen gas, an oxygen gas, and a radical supply gas.

3. The substrate treating method of claim 2, wherein the radical supply gas is a compound containing a fluorine atom.

4. The substrate treating method of claim 1, wherein the first heating temperature is about 100° C. at which the by-product layer of ammonium hexafluoro silicate is decomposed.

5. The substrate treating method of claim 4, wherein the second heating temperature is not lower than about 240° C.

6. The substrate treating method of claim 5, wherein the second heating temperature is not higher than about 500° C.

7. The substrate treating method of claim 1, further comprising supplying a hydrogen supply gas excited to a plasma state to the substrate to form a protective layer on the substrate from which the oxide layer is removed.

8. The substrate treating method of claim 7, wherein the hydrogen supply gas is one selected from an ammonia gas, a hydrogen gas, and a methane gas.

* * * * *